United States Patent [19]
Ong et al.

[11] Patent Number: 5,466,624
[45] Date of Patent: Nov. 14, 1995

[54] ISOLATION BETWEEN DIFFUSION LINES IN A MEMORY ARRAY

[75] Inventors: Tong-Chern Ong; Daniel N. Tang, both of San Jose, Calif.

[73] Assignee: Intel Corporation, Santa Clara, Calif.

[21] Appl. No.: 315,876

[22] Filed: Sep. 30, 1994

[51] Int. Cl.[6] ............................................. H01L 21/8247
[52] U.S. Cl. ............................ 437/52; 437/43; 437/48; 437/61
[58] Field of Search ................................. 437/43, 48, 52, 437/61, 69; 257/374, 315

[56] References Cited

U.S. PATENT DOCUMENTS

| | | | |
|---|---|---|---|
| 4,151,021 | 4/1979 | McElroy | 437/43 |
| 4,506,437 | 3/1985 | Godejahn, Jr. | 437/69 |
| 5,028,979 | 7/1991 | Mazzali . | |
| 5,075,245 | 12/1991 | Woo et al. | 437/69 |
| 5,102,814 | 4/1992 | Woo | 437/69 |
| 5,120,671 | 6/1992 | Tang et al. . | |
| 5,330,938 | 7/1994 | Camerlenghi | 437/43 |

Primary Examiner—Tom Thomas
Attorney, Agent, or Firm—Blakely, Sokoloff, Taylor & Zafman

[57] ABSTRACT

A method of forming a memory device with improved isolation between diffusion lines. Parallel, spaced apart thick oxide strips are grown on a substrate. Next, spaced apart, parallel strips having a polysilicon and nitride layer, oriented perpendicular to the first strips, are formed. The oxide between the second strips is removed, followed by an implantation to form source and drain regions. The nitride layer on the second strips is removed on those strips between two drain diffusions and an oxidation is performed to form self-aligned thick oxide over the source and drain regions. The strips from which the nitride has been removed are also oxidized, thus providing isolation between adjacent drain lines. In the formation of floating gate memory devices, a second polysilicon layer is deposited, and patterned in one direction to form strips overlying the second strips. After deposition of an intergate dielectric and a third polysilicon layer, a further patterning step is performed to form strips perpendicular to the second strips and second polysilicon layer and an etch is performed to etch the third polysilicon layer, intergate dielectric, second polysilicon layer and first polysilicon layer not covered by the patterning layer.

20 Claims, 8 Drawing Sheets

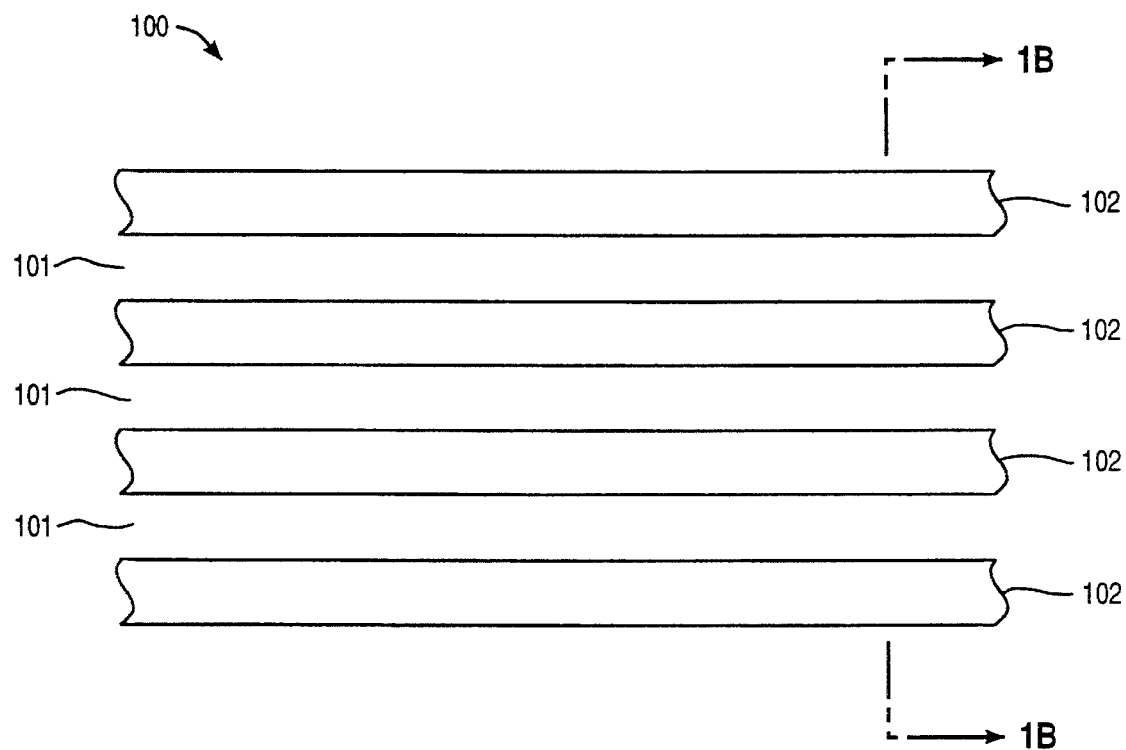
FIG_1A
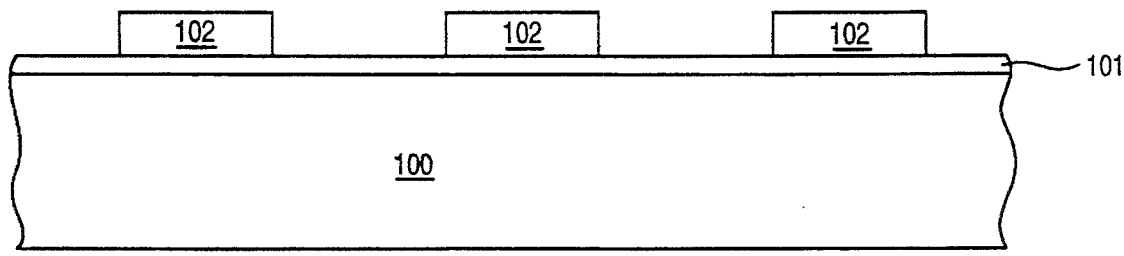
FIG_1B

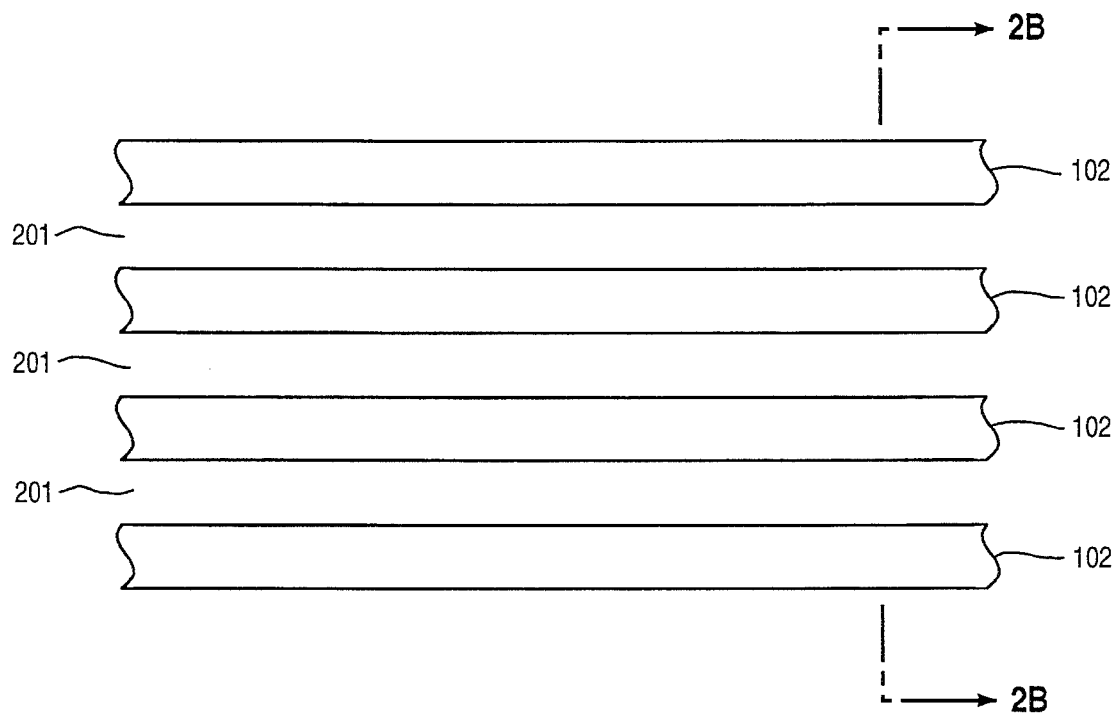
FIG_2A
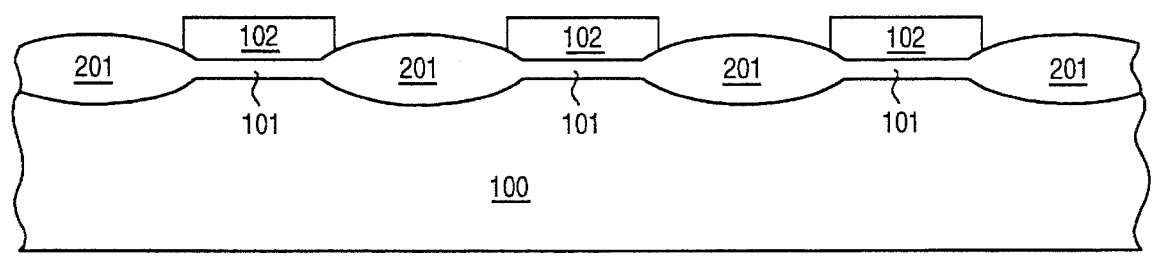
FIG_2B

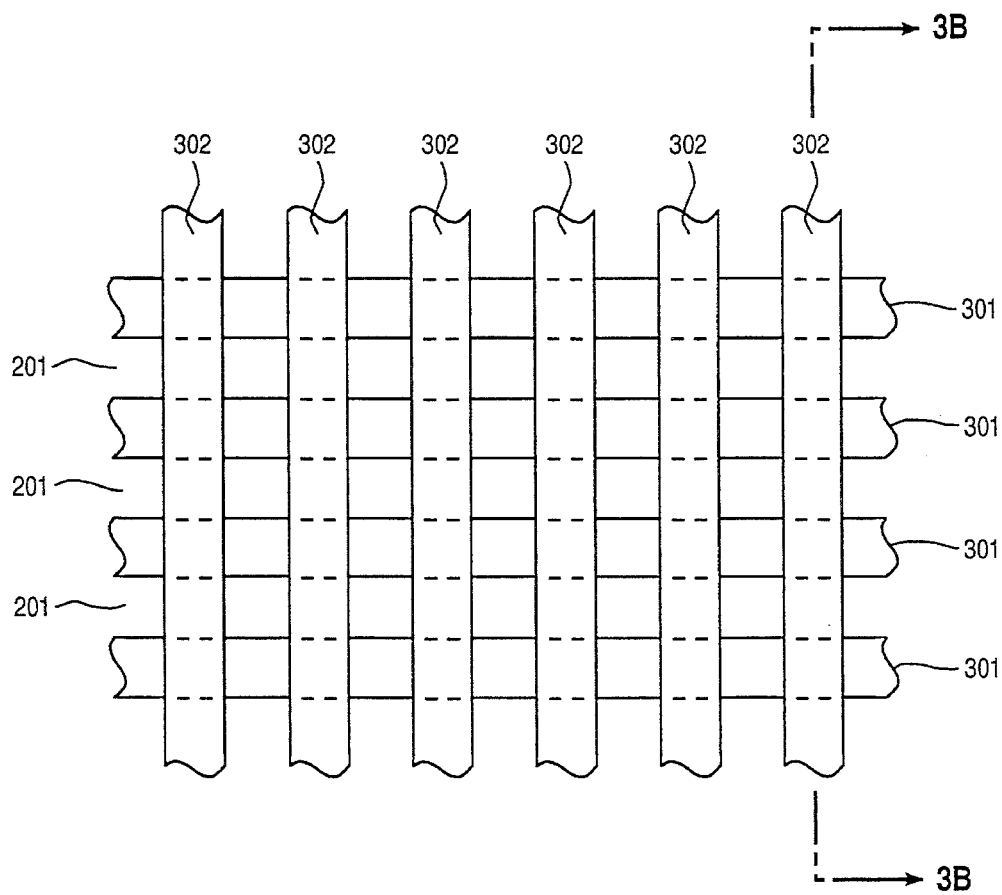
FIG_3A
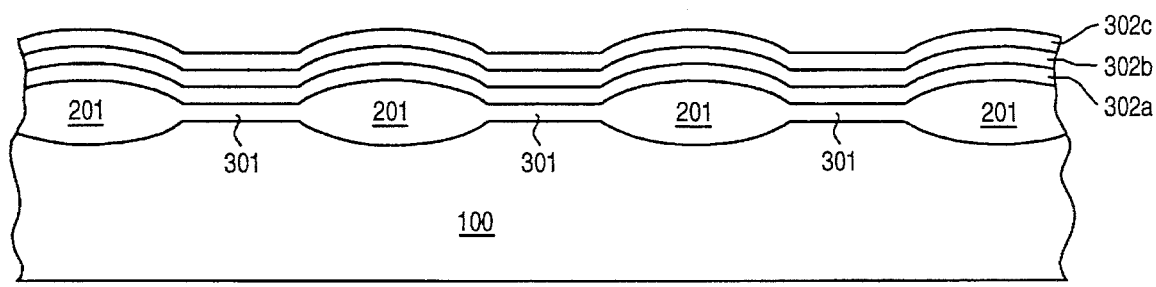
FIG_3B

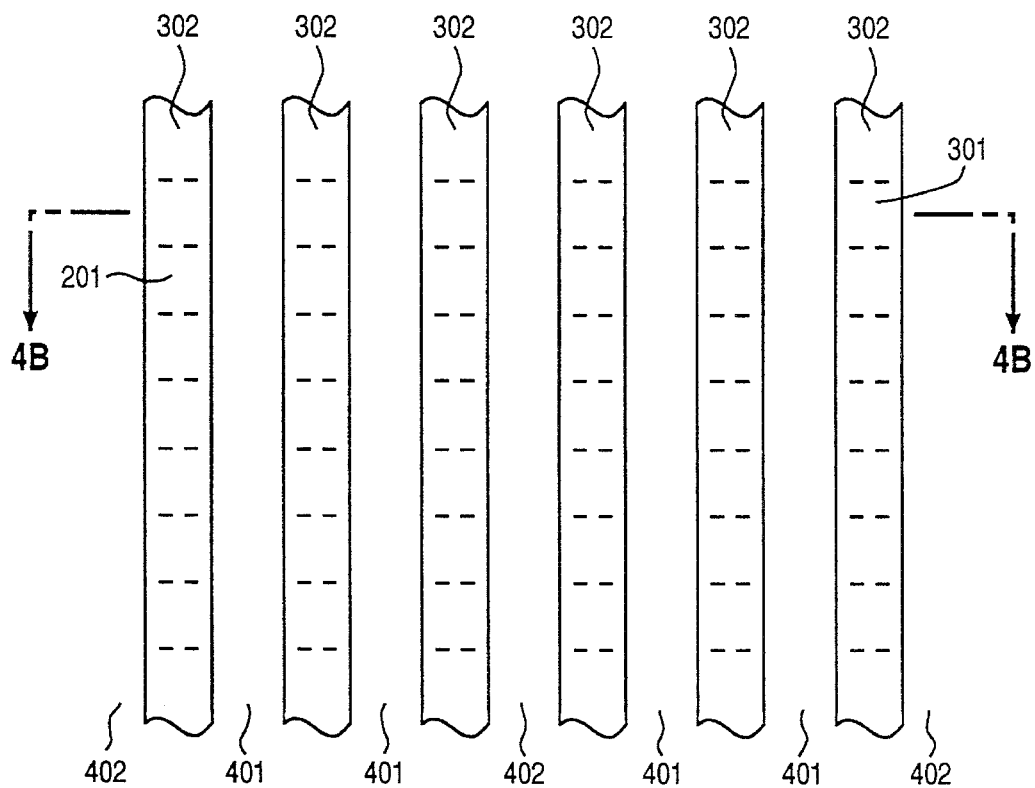
FIG_4A
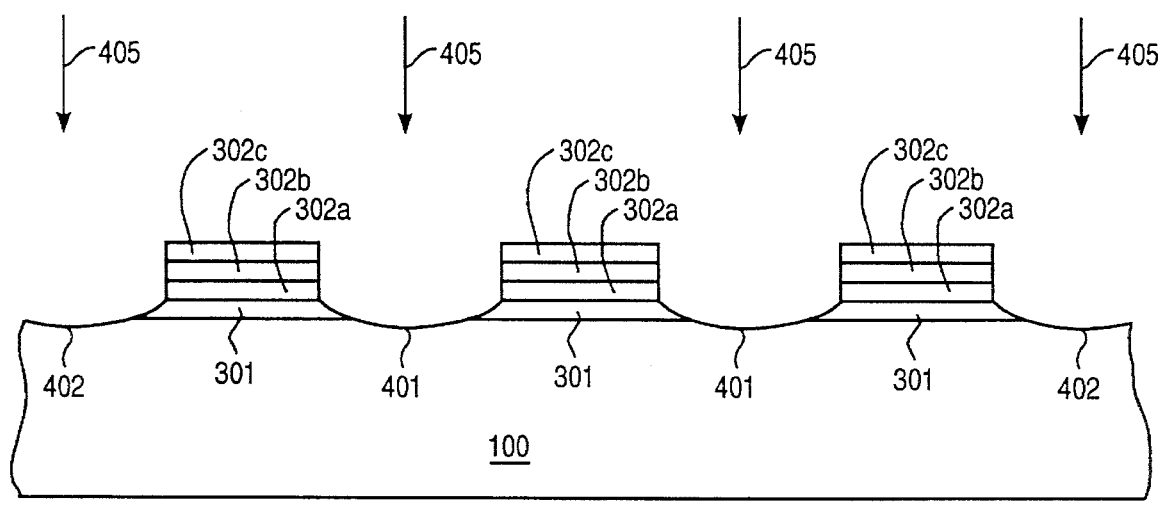
FIG_4B

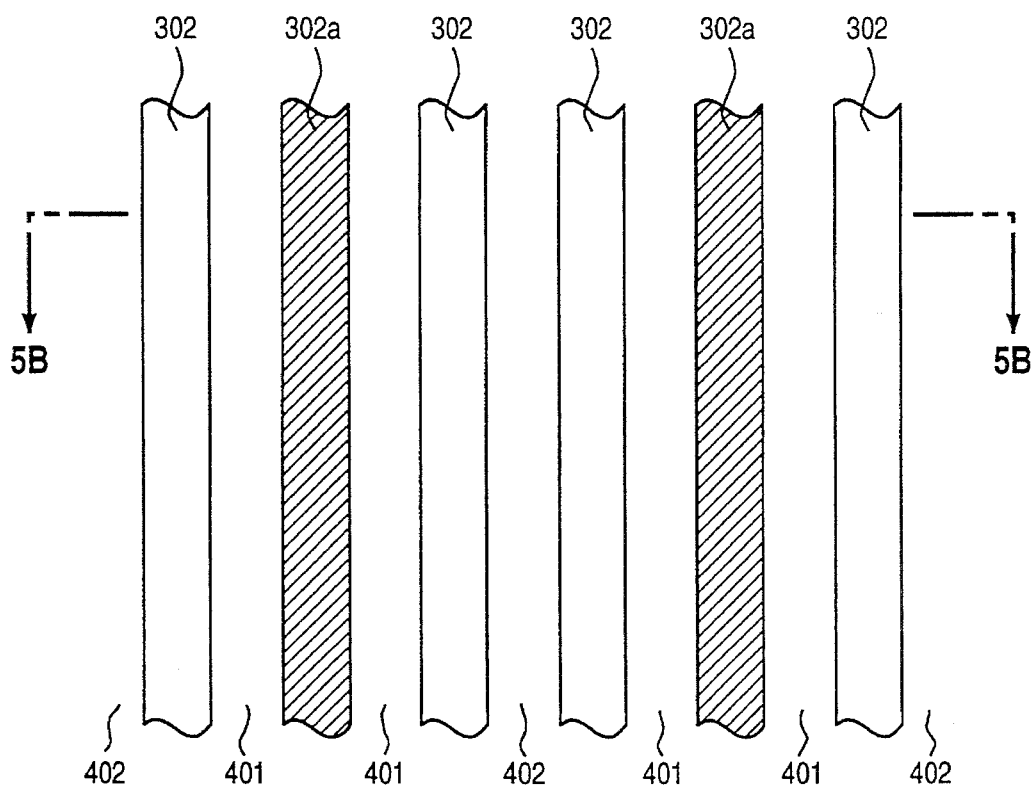
FIG_5A
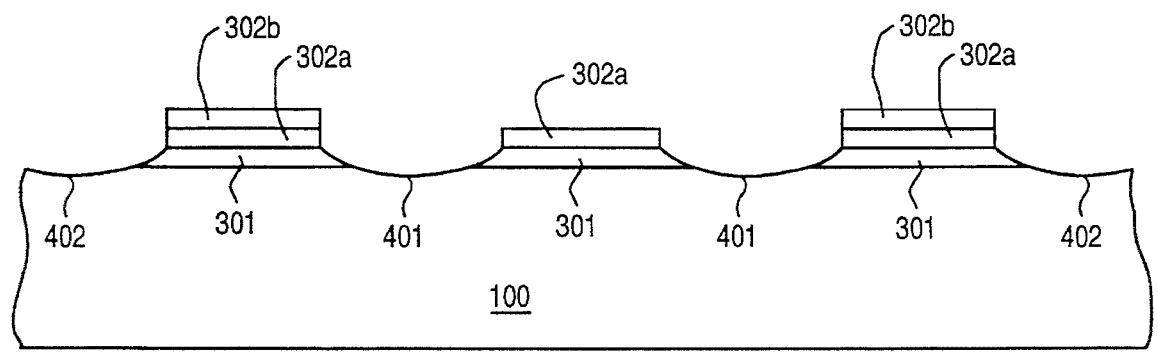
FIG_5B

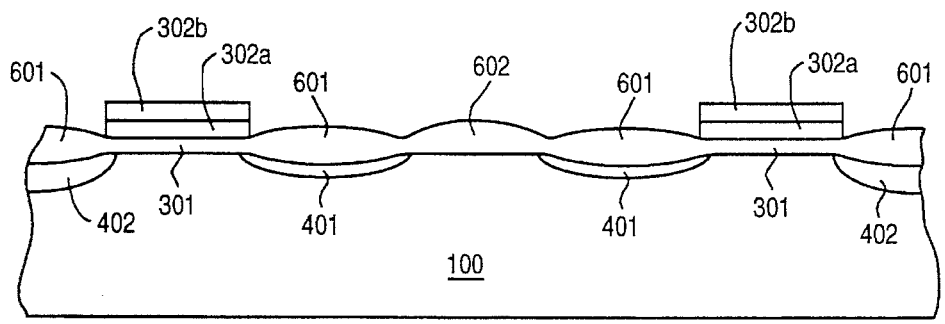
FIG_6
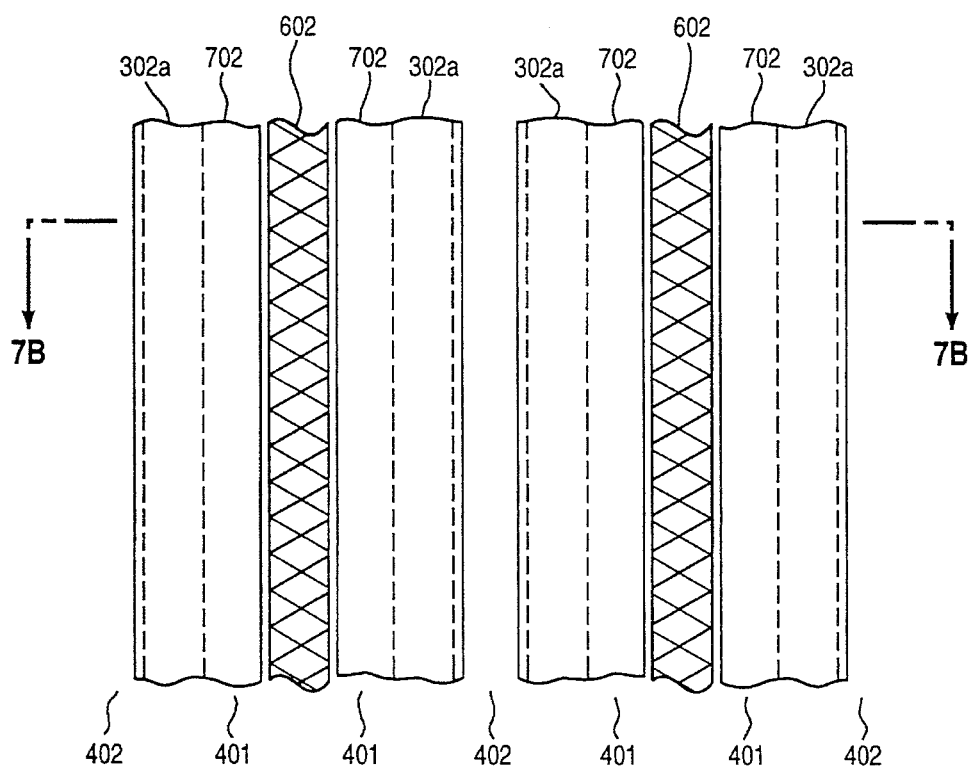
FIG_7A
FIG_7B
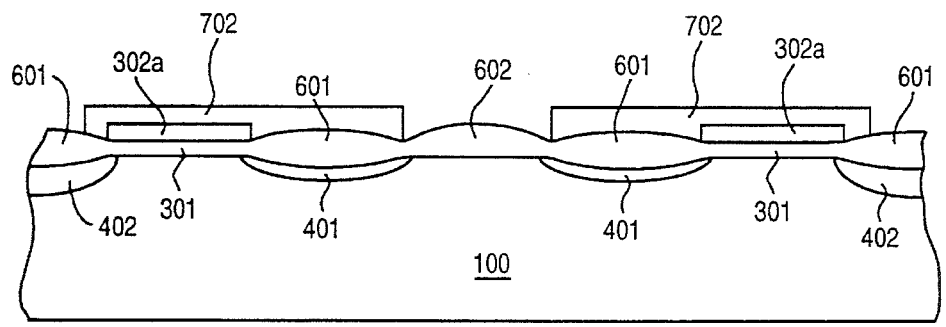

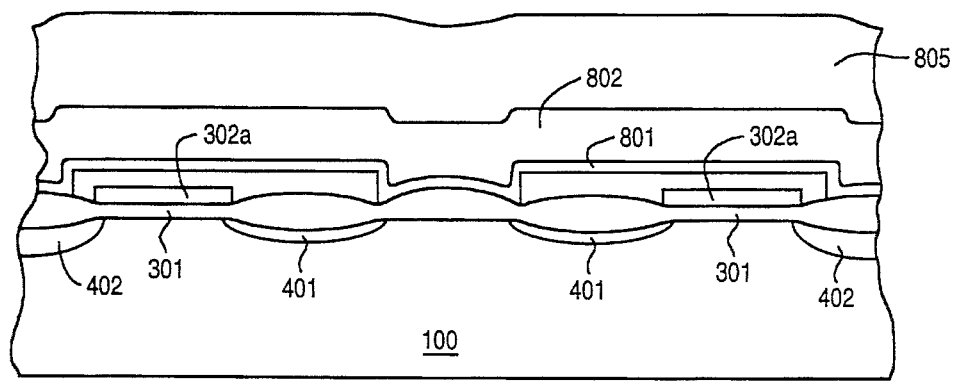
FIG_8
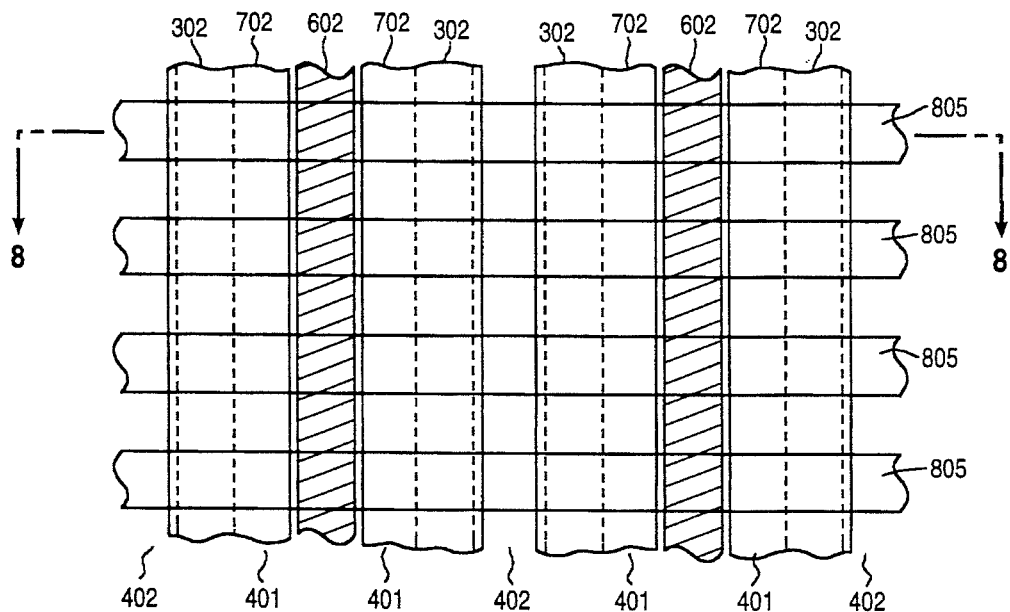
FIG_9
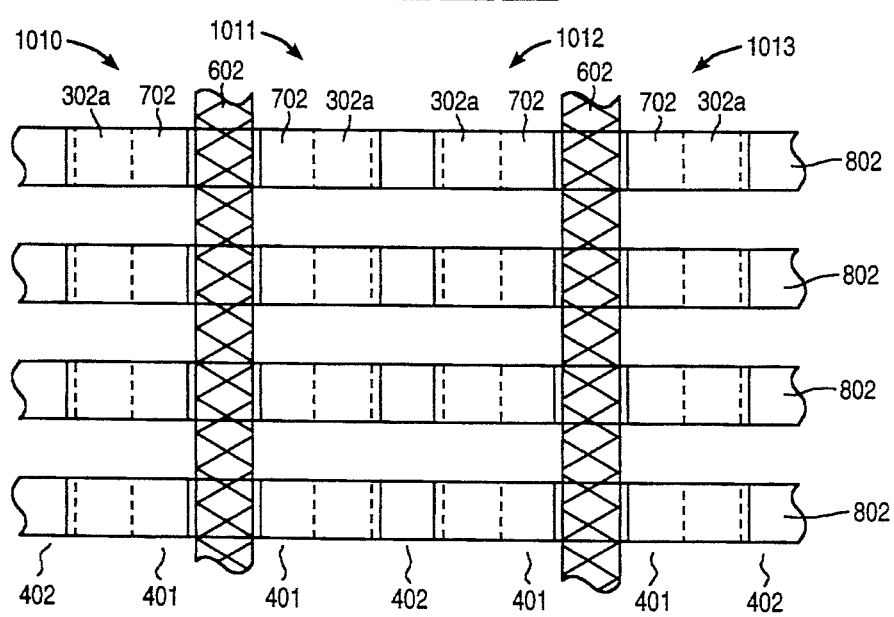
FIG_10

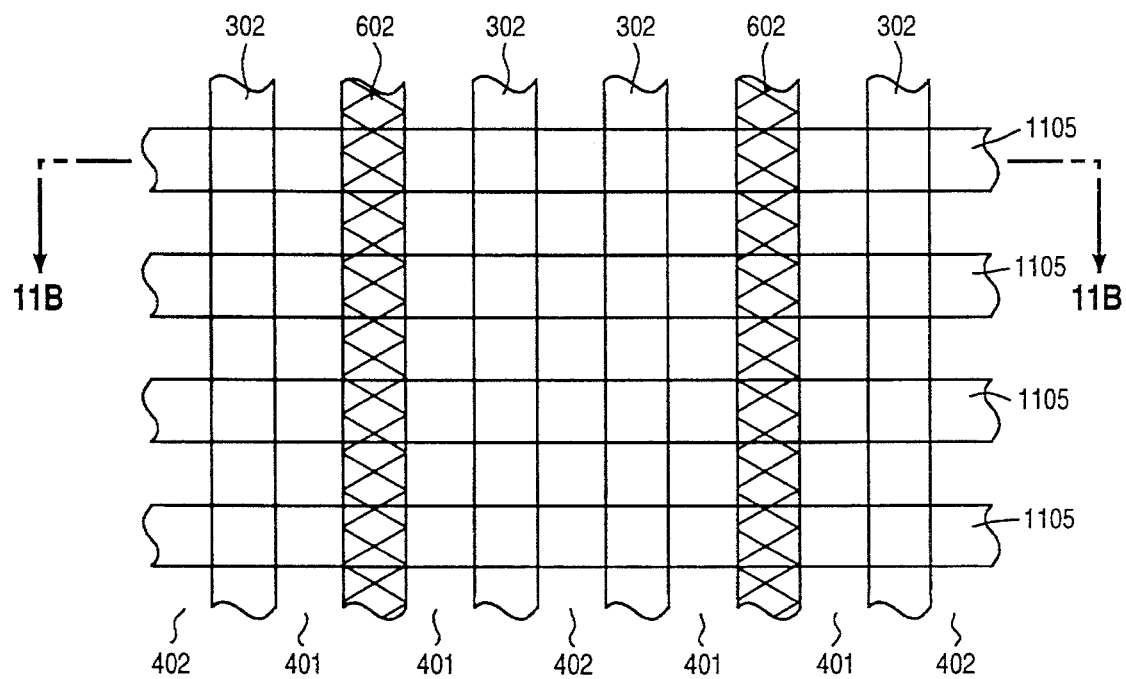
FIG_11A
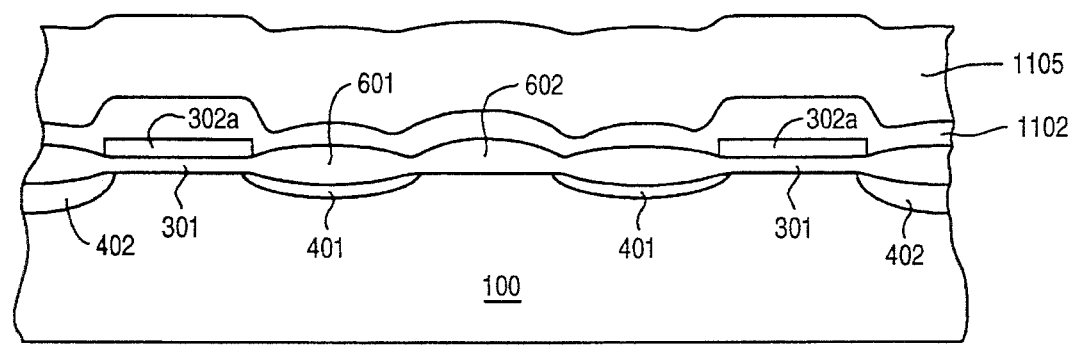
FIG_11B

ISOLATION BETWEEN DIFFUSION LINES IN A MEMORY ARRAY

BACKGROUND OF THE INVENTION

1. Field of the Invention

The present invention relates to memory devices, and more particularly to a method and apparatus for improved isolation between diffusion lines of the memory device.

2. Background Information

Numerous memory devices, including read only memory (ROM), programmable read only memory (PROM), electrically programmable read only memory (EPROM), electrically erasable programmable read only memory (EEPROM), etc., are well known and commercially available. In these devices, the memory can be arranged in an array comprising parallel, elongated, spaced-apart diffusion regions which function as the source and drain of the array. In this type of layout, the individual memory cells are arranged in rows and columns, with all cells in a column sharing a single drain diffusion and sharing a single source diffusion. Additionally, the source and drain regions typically alternate, such that adjacent columns of cells share each source and drain region. Strips of polysilicon run perpendicular to the diffusion regions to form the control gates.

Although sharing the same drain region with an adjacent column of cells results in a smaller cell size, this scheme complicates the decoder since, to access a cell, in addition to addressing the drain and word line of the cell, it is necessary to address one of the two source regions on each side of the drain. Additionally, a problem which may occur in such cells is parasitic program disturb, wherein an erased cell may get programmed during the programming of another cell on the same word line. This occurs because programming is typically accomplished by applying a voltage of, e.g. 12 V, on the word line, a voltage of, e.g. 6 V, on the drain line, and grounding the source of the cell to be programmed. In this situation, if the source of another cell on the same word line is allowed to float, it may be turned on temporarily as its capacitance is charged, and hence may be programmed. Therefore, to overcome this problem, most devices require complicated disturb prevention circuitry which, for example, holds the source of the cell that is not being programmed at some voltage during programming.

What is needed is a method for forming a non-volatile memory array with improved isolation between diffusion lines. The method should be compatible with conventional processing and allow for forming a variety of memory devices which do not require complicated decoders or disturb prevention circuitry.

SUMMARY OF THE INVENTION

A method of forming an array of memory devices is disclosed. First, parallel, spaced-apart strips comprising, e.g., nitride, are formed on a semiconductor substrate. Field oxide regions are then formed between the strips. The first strips are removed, a gate or tunnel oxide is grown, and second strips comprising, e.g., a first layer of polysilicon and a layer of, e.g., nitride are formed in a direction perpendicular to the first strips. The field oxide between the second strips is etched, followed by an ion implantation. The nitride layer is removed on some of the second strips. An oxide is grown over the source and drain regions, to form buried source and drain regions. Additionally, in this step, the polysilicon of the second strips which have had the nitride layer removed are oxidized as well. In this way, improved isolation between the diffusion lines is obtained. Next, a second layer of polysilicon is deposited. The second layer may, together with the polysilicon of the second strip, comprise the gate for a single polysilicon memory array. Alternatively, these layers may form the floating gate of a floating gate memory device. Next, an intergate dielectric, followed by a third polysilicon layer is deposited. The third polysilicon is defined and an etch is performed to etch the third polysilicon, the intergate dielectric, the second polysilicon layer, and the first polysilicon layer between the-third polysilicon lines.

Additional features and benefits of the present invention will become apparent from the detailed description, figures, and claims set forth below.

BRIEF DESCRIPTION OF THE DRAWINGS

The present invention is illustrated by way of example and not limitation in the accompanying figures in which:

FIG. 1A shows a top view of a semiconductor substrate after formation of first strips.

FIG. 1B shows a cross-sectional view of the structure of FIG. 1A.

FIG. 2A shows the structure of FIG. 1A after an oxidation step.

FIG. 2B shows a cross-sectional view of the structure of FIG. 2A.

FIG. 3A shows the structure of FIGS. 2A and 2B after formation of second strips.

FIG. 3B shows a cross-sectional view of the structure of FIG. 3A.

FIG. 4A shows the structure of FIG. 3A and 3B after an oxide etch.

FIG. 4B shows a cross-sectional view of the structure of FIG. 4A.

FIG. 5A shows the structure of FIGS. 4A and 4B after the nitride layer has been removed from some of the second strips.

FIG. 5B shows a cross-sectional view of the structure of FIG. 5A.

FIG. 6 shows a cross-sectional view of the structure of FIGS. 5A and 5B after an oxidation has been performed.

FIG. 7A shows the structure of FIG. 6 after formation of polysilicon strips over the second strips in the fabrication of a floating gate memory device.

FIG. 7B shows a cross-sectional view of the structure of FIG. 7A.

FIG. 8 shows a cross-sectional view of the structure of FIGS. 7A and 7B after deposition of an insulator, third polysilicon layer, and masking layer.

FIG. 9 shows a top view of the structure of FIG. 8.

FIG. 10 show the structure of FIG. 9 after an etch step.

FIG. 11A shows the structure of FIG. 6 after deposition of a polysilicon layer and formation of a patterning layer in the fabrication of a ROM device.

FIG. 11B shows a cross-sectional view of the structure of FIG. A.

DETAILED DESCRIPTION

A method of forming a memory array with improved isolation between diffusion lines is disclosed. In the following description, numerous specific details are set forth such as specific materials, device layers, fabrication steps and sequences, dimensions, etc. in order to provide a thorough understanding of the present invention. It will be obvious, however, to one skilled in the art that these specific details need not be employed to practice the present invention. In other instances, well known materials or methods have not been described in detail in order to avoid unnecessarily obscuring the present invention.

Referring now to FIG. 1A a top view of a semiconductor substrate 100 is shown. Prior to the point in processing in FIG. 1A, in a currently preferred embodiment, substrate 100 has had pad oxide 101 grown thereon. In a currently preferred embodiment, pad oxide has a thickness of approximately 100 Å–200 Å. Next, an oxidation mask is formed by depositing a blanket layer of, for example, nitride, approximately 1000 Å–2000 Å thick. This blanket layer is then patterned using standard lithographic techniques, and etched to form the strips 102 shown in FIG. 1A. FIG. 1B shows a cross-sectional view of the structure of FIG. 1A, along a portion of the section indicated in FIG. 1A. Following the stage of processing shown in FIGS. 1A and 1B, a recess etch is performed to remove a thickness of approximately 1000 Å–2000 Å of substrate 100 from the regions between strips 102. In one embodiment, this is followed by an ion implantation to increase the threshold voltage of the field oxide strips to be formed between the strips 102, as described below in conjunction with FIGS. 2A and 2B.

Referring to FIG. 2A a field oxide 201 is next grown between the strips 102. In a currently preferred embodiment, the field oxide is grown using a conventional local oxidation of silicon (LOCOS) process, to a thickness of approximately 2000 Å–3000 Å. FIG. 2B shows a cross-sectional view of the structure FIG. 2A through a portion of the cross-section indicated in FIG. 2A. Following the point of processing shown in FIGS. 2A and 2B, nitride strips 102, along with pad oxide layer 101 are etched away.

Next, a thin oxide, which may be a gate oxide or tunnel oxide, depending upon the device to be formed, is grown in the active areas, i.e. the areas previously covered by strips 102. Typically, the gate or tunnel oxide has a thickness of approximately 100 angstroms or less. Referring to FIG. 3A, thin oxide 301 is disposed between the field oxide 201, in the regions previously occupied by strips 102. Next, substantially parallel, spaced apart strips 302 are formed above and in a direction substantially perpendicular to the direction of the field oxide 201 and thin oxide 301. Strips 302 are formed by depositing a first layer 302a of, for example, polysilicon, of approximately 500–700 angstroms thickness, followed by a thin layer 302b of, for example, nitride having a thickness of approximately 200 angstroms in a currently preferred embodiment. Next, a patterning layer 302c is deposited and patterned using standard lithographic techniques to define the strips 302. Then, an etch of the polysilicon and nitride layers is performed to form the strips 302. FIG. 3B shows a cross-sectional view of the structure of FIG. 3A through a portion of the section indicated in FIG. 3A. As shown, each of the strips 302 comprise the polysilicon layer 302a, nitride layer 302b, and patterning layer 302c, as described above.

Following the stage of processing shown in FIGS. 3A and 3B, an etch of field oxide 201, and thin oxide 301, in the regions between the strips 302 is performed. In this step, it is preferable to use an etch having a high selectivity of oxide to silicon. For example, it is desirable that the etch have an oxide silicon selectivity of 10:1 or greater. Etch processes to achieve this are known to one of skill in the art.

FIG. 4A shows a top view of the substrate after the etch has been completed. FIG. 4B shows a cross-sectional view through a portion of the cross-section indicated in FIG. 4A. As shown in FIG. 4B, thin oxide 301 remains underneath strips 302, but not between the strips 302. In a similar way, field oxide 201 remains underneath the strips 302 along the cross-section not shown in FIG. 4B. As can be seen in FIGS. 4A and 4B, one of regions 401 (which will become drain regions), or regions 402 (which will become source regions), is present between each of the strips 302.

Referring to FIG. 4B, subsequent to the above-described oxide etch, an ion implantation, as shown by arrows 405 is performed on the substrate to form self-aligned source region 402 and drain regions 401. In a currently preferred embodiment, ion implantation 405 comprises arsenic and/or phosphorous. For example, in one embodiment, both regions 401 and 402 may be implanted with, for example, arsenic to a level in the range of approximately $0.2 \times 10^{15}/cm^2$ to $5 \times 10^{15}/cm^2$. Following this implantation, the patterning layer 302c may be removed, followed by a patterning layer which masks the drain regions 401 while exposing the source regions 402. Then, the source regions 402 may be implanted with phosphorus to a level of approximately $0.2 \times 10^{15}/cm^2$ to $0.8 \times 10^{15}/cm^2$. In this way, during a diffusion step, the source regions will diffuse deeper, with a more gradual dopant ingredient than the drain regions. It will be understood that following implantation, the dopant ions are present near the surface of substrate 100 in the implanted regions. For purposes of illustration, the implanted ions are not shown prior to diffusion in FIGS. 4A–5B.

Following the stage of processing shown in FIGS. 4A and 4B, patterning layer 302c, if it has not been removed during the source/drain implants, is removed. Next, an additional patterning layer is used to expose the strips 302 which lie between drain regions 401. For example, in a currently preferred embodiment, every third one of the strips 302 is exposed, which will provide for a shared source region between two drain regions 401, with the drain regions separated from other drain regions by isolation regions. After the patterning layer has been formed, exposing the above-described ones of strips 302, an etch of the nitride layer 302b from the exposed strips 302 is performed. Referring now to FIG. 5A, as shown, two of the strips 302, identified by cross-hatching and reference numeral 302a, have had nitride layer 302b removed. The remaining strips 302 continue to have both polysilicon layer 302a and nitride layer 302b. In FIG. 5A the oxide regions 201 and 301 beneath the strips 302 are not shown for clarity. FIG. 5B shows a cross-section of the structure of FIG. 5A, through a portion of the section indicated in FIG. 5A.

Next, a low temperature (for example, approximately 850° C.) oxidation is performed in steam to form a self aligned thick oxide on top of the source and drain regions, thus forming buried source and drain regions. Referring to FIG. 6, a cross-sectional view through the same portion as shown in FIG. 5B, after the oxidation, is shown. During this oxidation, the regions of the substrate not masked by the strips 302 now have self aligned thick oxide 601 therein, disposed directly above either a source 402 or drain 401. Additionally, the polysilicon layer 302a of the strips 302 between drain regions 401, which have had nitride layer 302b removed, is oxidized to form oxide region 602.

As shown in FIG. 6, the oxidized polysilicon 602 now serves to isolate the two adjacent bit lines 401, such that each device in a column has its own drain 401 without sharing the drain 401 with adjacent cells. In this way, the decoder design is made less complicated since there is no need to address the source region 402. Additionally, because the drain is common to the cells in a single column, and is not adjacent to two sources, there is no need to apply a disturb prevention voltage to other sources along the same word line. Thus, the problem of program disturb is prevented, thereby eliminating the need for disturb prevention circuitry. Following the oxidation, the nitride layer 302b is removed from the remaining strips 302, to expose the polysilicon layer 302a.

The array of the present invention may be used, for example, for single polysilicon memories such as read only memories (ROM) and may also be used for various floating gate type memories. In an embodiment where a floating gate device is formed, in a preferred embodiment a layer of, for example, polysilicon is deposited and patterned as shown by polysilicon lines 702 of FIG. 7A. As shown, each of the polysilicon strips 702 overlaps each of the first strips 302a which were not oxidized, on both sides. This overlap provides full coverage of the first polysilicon strip 302a, which provides for good control of the polysilicon etch in forming the strips 702, since no etch of the first polysilicon strip 302a can occur during the etch to form the strips 702. Also shown in FIG. 7A is the oxide layer 602 formed from the first polysilicon layer 302a in the strips 302 between diffusion regions 401. Although thick oxide regions 601 are not shown in FIG. 7A, they are understood to be present alongside the oxide regions 602 and generally continuous therewith as shown in FIG. 6.

Referring now to FIG. 7B, a cross-sectional view of the structure of FIG. 7A, along a portion of the section indicated in FIG. 7A, is shown. As can be seen in FIG. 7B, since the source regions 402 and drain regions 401 are buried beneath the thick oxide region 601, the second polysilicon layer 702 may have the overlap described above without contact to the source regions 402 or drain regions 401. Additionally, as shown, second polysilicon layer 702 overlaps on the side of the drain 401 to a greater extent than on the side of the source 402. As will be seen, the polysilicon layers 302a and 702 together comprise the floating gate of the device. By overlapping the drain 401 to the extent shown, good floating gate to drain capacitive coupling is achieved, which is helpful in the programming and reading of many types of devices. Additionally, with only a minimal floating gate to source overlap, high fields may be established allowing for faster erase from the source 402.

It will be appreciated that the second polysilicon layer 702 may overlap either the source 402 or the drain 401 to a greater or lesser extent than that shown depending upon desired device characteristics. It will also be appreciated that in some devices, the polysilicon layer 702 may not be needed, and the floating gate may be made from polysilicon layer 302a alone.

Following the stage of processing shown in FIG. 7A and FIG. 7B, one or more dielectric layers is deposited on the substrate. For example, in a currently preferred embodiment a three layer composite dielectric comprising a first oxide layer having a thickness in the range of approximately 50 Å, a layer of nitride having a thickness of approximately 100 Å, and a second oxide layer having a thickness of approximately 50 Å is deposited. Referring briefly to FIG. 8, which is along the same cross-section as FIG. 7B, this composite dielectric layer is shown as intergate dielectric 801. Following deposition of the composite intergate dielectric 801, a conductive layer comprising, in a currently preferred embodiment polysilicon having a thickness in the range of approximately 1500 Å, and a metal or silicide layer such as tungsten or tungsten silicide having a thickness in the range of approximately 1500 Å is deposited, as shown by layer 802 of FIG. 8. Next, a patterning layer 805 is formed by standard lithographic techniques.

Referring now to FIG. 9, a top view of the structure of FIG. 8 is shown. The location of the cross-sectional view of FIG. 8 is indicated in FIG. 9. As can be seen, patterning layer 805 is patterned into strips which run substantially perpendicular to the polysilicon strips 702 and disposed substantially above the active area of the device, including above the region having tunnel oxide 301.

After formation of the patterning layer 805, an etch through the polysilicon layer 802, intergate dielectric layer 801, polysilicon layer 702, and polysilicon layer 302a, in the regions not covered by the patterning layer 805 is performed. Following the etch, and removal of patterning layer 805, the substrate appears as shown in FIG. 10. In each cell, the floating gate comprises polysilicon layer 302a, and polysilicon 702 which overlaps and is in contact with layer 302a as discussed previously. Further, the strips 802 form the control gate of the device. In FIG. 10, four columns of devices, 1010, 1011, 1012, 1013, are shown. As described previously, while adjacent columns such as column 1011 and 1012 share a single source 402, each of the columns has its own drain 401. It will be understood that a device may comprise any number of columns. Additionally, although four rows are shown in FIG. 10, the device may comprise any number of such rows. In a preferred embodiment, a contactless array is fabricated, i.e., each source 402 and drain 401 does not have a contact at each cell. Since the drain regions 401 and source regions 402 are continuous and common to each cell in a column, contact need not necessarily be made at each cell, but rather can be made at a common point along the diffusion lines. In a preferred embodiment, contact is made to each drain 401, and source 402 at approximately every sixteen cells or so along a column. It will be appreciated that this may be varied, depending upon the acceptable voltage drop (due to resistance along the diffusion lines) at cells distant from the contacts.

As described earlier, the array of the present invention may be used to fabricate the floating gate device described above, as well as single polysilicon memories such as ROMs. In the fabrication of a ROM, after the stage of processing shown in FIG. 6, and deposition of a second conductive layer, for example, polysilicon layer 1102, which is substantially similar to layer 702, a patterning layer 1105 is formed as shown in FIG. 11A. For clarity, the field oxide and thin oxide regions are not shown in FIG. 11A. As shown, the patterning layer 1105 forms parallel strips covering the active area of the devices and extending substantially perpendicular to the source/drain strips. A multi-step etch process is then performed to remove those portions of layer 1102 not masked by the patterning layer strips 1105. Additionally in this process, the exposed portions of the intergate dielectric 801 and first polysilicon layer 302a between the patterning layer strips 1105 is also removed. Layer 1102, together with polysilicon layer 302a, makes up the gate of the device. FIG. 11B shows a cross-sectional view of the structure of FIG. 11A through a portion of the section indicated in FIG. 11A. In the case of a ROM, thin oxide 301 comprises a gate oxide.

It will be appreciated that many modifications to the above described embodiments may be made by one of skill in the art. For example, different materials may be used in place of the various layers such as the polysilicon layers, nitride layers and dielectric layers, depending upon device and process requirements. Further, the polysilicon layer 702 may not be required in all cases, depending upon device requirements. As described above, use of the second polysilicon layer 702, patterned to have the asymmetrical overlap described above, results in improved device performance for many types of devices. In addition, the sequence of processing steps, including implantations, and depositions may be varied, and it is understood that the present invention is not limited to the processing sequence as described above. Finally, numerous other steps may be carried out either before, during, or after the processing described above to form the completed device. For example, in forming a ROM memory, a masked implant is typically carried out to program the device. As another example, although the fabrication of a buried bit line device has been described, the present invention may be used in the fabrication of devices wherein diffusion lines are not buried under the thick oxide regions 601.

Thus, a method for forming improved isolation between diffusion lines in a memory array has been described. Although specific embodiments, including specific equipment, parameters, methods, and materials have been described, various modifications to the disclosed embodiments will be apparent to one of ordinary skill in the art upon reading this disclosure. Therefore, it is to be understood that such embodiments are merely illustrative of and not restrictive on the broad invention and that this invention is not limited to the specific embodiments shown and described.

What is claimed is:

1. A method of forming a memory device comprising the steps of:

forming substantially parallel spaced apart first strips on a semiconductor substrate;

forming first oxide regions between said first strips;

forming substantially parallel spaced apart second strips on said substrate, said second strips oriented substantially perpendicular to said first strips, said second strips comprising a first conductive layer and a first masking layer; and, forming electrical isolation between adjacent diffusion lines by oxidizing said conductive layer of a first set of said second strips comprising at least two of said second strips, said first set separated by a second set of said second strips comprising at least two of said second strips.

2. The method as described in claim I wherein said oxidizing step additionally oxidizes said substrate between said second strips.

3. The method as described in claim I further comprising doping said substrate in regions between said second strips prior to oxidizing said first conductive layer of said first set of said second strips.

4. The method as described in claim 3 wherein said doped regions between said second strips comprise source and drain regions, wherein adjacent ones of said drain regions are separated by at least one of said oxidized second strips.

5. The method as described in claim 1 further comprising forming third strips comprising a second conductive layer over and in electrical contact with said first conductive layer of said second strips.

6. The method as described in claim 4 further comprising forming third strips comprising a second conductive layer over and in electrical contact with said first conductive layer of said second strips.

7. The method as described in claim 5 wherein said third strips are formed by depositing said second conductive layer, forming a patterning layer on said second conductive layer having patterning layer strips corresponding to said third strips, said patterning layer strips being substantially perpendicular to said second strips, and removing said second conductive layer from regions not masked by said patterning layer strips, wherein portions of said first conductive layer between said patterning layer strips are also removed, wherein said first conductive layer and said second conductive layer form a gate of a ROM device.

8. The method as described in claim 6 wherein said third strips are formed by depositing said second conductive layer, forming a patterning layer on said second conductive layer having patterning layer strips corresponding to said third strips, said patterning layer strips being substantially perpendicular to said second strips, and removing said second conductive layer from regions not masked by said patterning layer strips, wherein portions of said first conductive layer between said patterning layer strips are also removed, wherein said first conductive layer and said second conductive layer form a gate of a ROM device.

9. The method as described in claim 5 wherein said third strips are formed by depositing said second conductive layer, forming a patterning layer on said second conductive layer having patterning layer strips corresponding to said third strips, said patterning layer strips being substantially parallel to said second strips and overlapping said second strips, and removing said second layer from regions not masked by said patterning layer strips, wherein said first conductive layer and said conductive layer form a floating gate of a floating gate memory device.

10. The method as described in claim 6 wherein said third strips are formed by depositing said second conductive layer, forming a patterning layer on said second conductive layer having patterning layer strips corresponding to said third strips, said patterning layer strips being substantially parallel to said second strips and overlapping said second strips, and removing said second layer from regions not masked by said patterning layer strips, wherein said first conductive layer and said conductive layer form a floating gate of a floating gate memory device.

11. The method as described in claim 9 further comprising forming fourth strips comprising a third conductive layer over said second conductive layer, said third conductive layer insulated from said second conductive layer by an insulative layer, said fourth strips formed by depositing said third conductive layer, forming a second patterning layer on said third conductive layer having second patterning layer strips corresponding to said fourth strips, said second patterning layer strips being substantially perpendicular to said third strips, and removing said third conductive layers from regions not masked by said second patterning layer strips, wherein portions of said first conductive layer, said insulative layer, and said second conductive layer between said second patterning layer strips are removed, wherein said third conductive layer comprises a control gate.

12. The method as described in claim 10 further comprising forming fourth strips comprising a third conductive layer over said second conductive layer, said third conductive layer insulated from said second conductive layer by an insulative layer, said fourth strips formed by depositing said third conductive layer, forming a second patterning layer on said third conductive layer having second patterning layer strips corresponding to said fourth strips, said second patterning layer strips being substantially perpendicular to said third strips, and removing said third conductive layers from regions not masked by said second patterning layer strips, wherein portions of said first conductive layer, said insulative layer, and said second conductive layer between said second patterning layer strips are removed, wherein said third conductive layer comprises a control gate.

13. The method as described in claim 10 wherein said third strips overlap said drain region to a greater extent than said source region.

14. The method as described in claim 12 wherein said third strips overlap said drain region to a greater extent than said source region.

15. A method of forming a memory device comprising the steps of:

forming substantially parallel spaced apart first strips on a semiconductor substrate;

forming first oxide regions between said first strips;

forming substantially parallel spaced apart second strips on said substrate, said second strips oriented substantially perpendicular to said first strips, said second strips comprising a first conductive layer and a first masking layer;

forming doped regions between said second strips, said doped regions comprising source regions and drain regions; and, forming electrical isolation between said drain regions by oxidizing said conductive layer of those second strips between two of said drain regions.

16. The method as described in claim 15 wherein said oxidizing step additionally oxidizes said substrate between said second strips.

17. The method as described in claim 15 further comprising forming third strips comprising a second conductive layer over and in electrical contact with said first conductive layer of said second strips.

18. The method as described in claim 17 wherein said third strips are formed by depositing said second conductive layer, forming a patterning layer on said second conductive layer having patterning layer strips corresponding to said third strips, said patterning layer strips being substantially perpendicular to said second strips, and removing said second conductive layer from regions not masked by said patterning layer strips, wherein portions of said first conductive layer between said patterning layer strips are also removed, wherein said first conductive layer and said second conductive layer form a gate of a ROM device.

19. The method as described in claim 17 wherein said third strips are formed by depositing said second conductive layer, forming a patterning layer on said second conductive layer having patterning layer strips corresponding to said third strips, said patterning layer strips being substantially parallel to said second strips and overlapping said second strips, and removing said second layer from regions not masked by said patterning layer strips, wherein said first conductive layer and said conductive layer form a floating gate of a floating gate memory device.

20. The method as described in claim 19 further comprising forming fourth strips comprising a third conductive layer over said second conductive layer, said third conductive layer insulated from said second conductive layer by an insulative layer, said fourth strips formed by depositing said third conductive layer, forming a second patterning layer on said third conductive layer having second patterning layer strips corresponding to said fourth strips, said second patterning layer strips being substantially perpendicular to said third strips, and removing said third conductive layers from regions not masked by said second patterning layer strips, wherein portions of said first conductive layer, said insulative layer, and said second conductive layer between said second patterning layer strips are removed, wherein said third conductive layer comprises a control gate.

* * * * *

UNITED STATES PATENT AND TRADEMARK OFFICE
CERTIFICATE OF CORRECTION

PATENT NO. : 5,466,624
DATED : November 14, 1995
INVENTOR(S) : Ong et al.

It is certified that error appears in the above-identified patent and that said Letters Patent is hereby corrected as shown below:

In column 2 at line 12 delete "the-third" and insert --the third--

In column 4 at line 17 delete "$0.2 \times 10^{15}/cm^2$" and insert --$1 \times 10^{15}/cm^2$--

Signed and Sealed this

Fifth Day of November, 1996

Attest:

BRUCE LEHMAN

Attesting Officer  Commissioner of Patents and Trademarks